(12) United States Patent
Loo et al.

(10) Patent No.: US 8,507,337 B2
(45) Date of Patent: Aug. 13, 2013

(54) METHOD FOR DOPING SEMICONDUCTOR STRUCTURES AND THE SEMICONDUCTOR DEVICE THEREOF

(75) Inventors: Roger Loo, Kessel-Lo (BE); Frederik Leys, Gentbrugge (BE); Matty Caymax, Leuven (BE)

(73) Assignee: IMEC, Leuven (BE)

( * ) Notice: Subject to any disclaimer, the term of this patent is extended or adjusted under 35 U.S.C. 154(b) by 22 days.

(21) Appl. No.: 13/002,749

(22) PCT Filed: Jul. 6, 2009

(86) PCT No.: PCT/EP2009/058529
§ 371 (c)(1),
(2), (4) Date: Mar. 28, 2011

(87) PCT Pub. No.: WO2010/003928
PCT Pub. Date: Jan. 14, 2010

(65) Prior Publication Data
US 2011/0169049 A1 Jul. 14, 2011

Related U.S. Application Data

(60) Provisional application No. 61/078,403, filed on Jul. 6, 2008.

(51) Int. Cl.
*H01L 21/8238* (2006.01)

(52) U.S. Cl.
USPC .................................................... 438/199

(58) Field of Classification Search
None
See application file for complete search history.

(56) References Cited

U.S. PATENT DOCUMENTS

| | | | |
|---|---|---|---|
| 5,354,710 A | 10/1994 | Kawaguchi et al. | |
| 5,599,735 A | 2/1997 | Moslehi | |
| 5,882,991 A | 3/1999 | Paranjpe | |
| 5,998,271 A | 12/1999 | Schwalke | |
| 7,687,383 B2 * | 3/2010 | Bauer | 438/510 |
| 2002/0022354 A1 | 2/2002 | Furukawa et al. | |
| 2005/0202618 A1 | 9/2005 | Yagishita | |
| 2007/0026615 A1 | 2/2007 | Goktepeli et al. | |

(Continued)

FOREIGN PATENT DOCUMENTS

| DE | 19813188 | 10/1999 |
|---|---|---|
| EP | 0430168 | 6/1991 |

(Continued)

OTHER PUBLICATIONS

"Low-Frequency Noise Characteristics in Strained-Si nMOSFETs"; Yen Ping Wang, SanLein Wu and Shoou Jinn Chang; IEEE Electon device letters, vol. 28, No. 1, Jan. 2007.*

(Continued)

*Primary Examiner* — Charles Garber
*Assistant Examiner* — Andre' C Stevenson
(74) *Attorney, Agent, or Firm* — McDonnell Boehnen Hulbert & Berghoff LLP (57) ABSTRACT

A method for introducing species into a strained semiconductor layer comprising: providing a substrate comprising a first region comprising an exposed strained semiconductor layer, loading the substrate in a reaction chamber, then forming a conformal first species containing-layer by vapor phase deposition (VPD) at least on the exposed strained semiconductor layer, and thereafter performing a thermal treatment, thereby diffusing at least part of the first species from the first species-containing layer into the strained semiconductor layer and activating at least part of the diffused first species in the strained semiconductor layer.

25 Claims, 7 Drawing Sheets

(56) References Cited

U.S. PATENT DOCUMENTS

| | | | |
|---|---|---|---|
| 2007/0087574 A1 | 4/2007 | Gupta et al. | |
| 2007/0096196 A1 | 5/2007 | Hofmann et al. | |
| 2007/0166846 A1 | 7/2007 | Sasaki et al. | |
| 2008/0176367 A1* | 7/2008 | Noguchi et al. | 438/199 |

FOREIGN PATENT DOCUMENTS

| | | |
|---|---|---|
| EP | 0606114 | 7/1994 |
| JP | 63-166220 | 7/1988 |
| WO | WO86/04454 | 7/1986 |
| WO | WO2006/079964 | 8/2006 |
| WO | WO2007/071555 | 6/2007 |

OTHER PUBLICATIONS

PCT Partial International Search Report, PCT International Application No. PCT/EP2009/058529.

Wang, Yen Ping et al., "Low-Frequency Noise Characteristics in Strained-Si nMOSFETs", IEEE Electron Device Letters, vol. 28, No. 1, Jan. 2007, pp. 36-38.

Song, Yun-Heub et al, "Ultrashallow Junctions Formation by Rapid Thermal Annealing of Arsenic-Adsorbed Layer", Jpn. J. Appl. Phys., vol. 39, 2000, pp. 26-30.

Sumitomo, Takamichi et al., "Arsenic Diffusion in Strained Si/Relaxed Si1-xGex and its Electrical Characteristics", Ext. Abs. the 7th International Workshop on Junction Technology, 2007, pp. 65-66.

Song, Y.H. et al., "A Novel Atomic Layer Doping Technology for Ultra-Shallow Junction in Sub-0.1um MOSFETs", International Electron Devices Meeting, IEDM. Technical Digest, Washington, D.C., Dec. 5-8, 1999, pp. 505-508.

PCT International Search Report, PCT International Serial No. PCT/EP2009/058529 dated Mar. 12, 2010.

Chiba, Yohei et al., "Epitaxial Growth of P Atomic Layer Doped Si Film by Alternate Surface Reactions of PH3 and Si2H6 on Strained Si1-xGex/Si(100) in Ultraclean Low-Pressure CVD", Semiconductor Science and Technology, vol. 22, No. 1, Jan. 2007, pp. S118-S122.

Rochefort, C. et al., "Manufacturing of High Aspect-Ration p-n Junction Using Vapor Doping for Application in Multi-Resurf Devices", IEEE, 2002, pp. 237-240.

Sasaki, Y. et al., "Gas Phase Doping at Room Temperature", Extended Abstracts of International Workshop on Junction Technology, 2002, pp. 39-40.

Tillack, B., "Atomic Control of Doping During SiGe Epitaxy", Thin Solid Films, vol. 318, 1998, pp. 1-5.

Theunissen, M.J.J. et al., "Boron Vapour Phase Doping of Silicon for Bipolar Device Applications", Jpn. J. Appl. Phys., vol. 38, 1999, pp. 5805-5814.

* cited by examiner

METHOD FOR DOPING SEMICONDUCTOR STRUCTURES AND THE SEMICONDUCTOR DEVICE THEREOF

CROSS-REFERENCE TO RELATED APPLICATIONS

The present application is a national stage application of International Patent Application no. PCT/EP2009/058529, which claims priority to U.S. Provisional Patent Application No. 61/078,403.

TECHNICAL FIELD OF THE INVENTION

The invention is related to semiconductor devices and methods of manufacturing semiconductor devices. Particularly, the invention is related to methods for doping semiconductor structures and the semiconductor devices obtained thereof.

BACKGROUND OF THE INVENTION

Strained-silicon technology is a promising route to enhance metal-oxide-semiconductor field-effect transistor (MOSFET) performance due to improved carrier transport properties.

In particular, biaxially-strained silicon on insulator substrate (abbreviated SSOI) is a promising source of strain engineering for the future CMOS technology nodes. The tensile stress in the Si layer results in an increased carrier mobility with respect to unstrained SOI. This in turn results in an enhanced drive current.

As the scaling of strained-Si MOSFETs continues, the performance enhancement may become susceptible to degradation during processing, particularly from ion implantation and thermal processing effects.

More specifically, the ion implant dose under the gate (e.g., associated with the halo and/or extensions implants) increases with scaling. In addition, the damage associated with the source/drain extension regions may comprise a larger portion of the channel as the device is scaled. Ion implantation damage may supply point defects that assist the relaxation of strain or the up-diffusion of species (e.g. Ge) from the underlying layers.

Moreover, residual ion implantation damage remaining after thermal annealing may act as carrier scattering centers. In strained-Si films thermal processing such as i.e. post implantation anneal can cause misfit dislocations, leading to strain relaxation as well as enhanced impurity diffusion, resulting ultimately in decreased carrier mobility.

When compared to planar junctions, junction formation on multi-gate 3-D structures, commonly referred to as FinFET or MuGFET present additional challenges in achieving conformal doping profiles. More specifically, because of the unidirectional nature of the ion beam and of the shadowing effect at elevated structures (fins), it becomes more and more difficult to achieve a conformal FinFET junction using conventional ion implantation technique.

In addition to that, for very narrow fin structures the amorphization caused by the conventional ion implantation cannot be fully recovered by thermal anneal.

Despite the progress in the art, there is still need for a method for doping strained semiconductor layers or narrow semiconductor structures (e.g. fin structures in FinFET devices) that can replace the conventional ion implantation technique and possibly the subsequent thermal annealing steps, while keeping the device performance un-altered or improving it.

SUMMARY OF THE INVENTION

According to one aspect of the present invention, it is provided a method for introducing species into a strained semiconductor layer, wherein the method comprises (or consists of) the steps of:
 a) providing in a reaction chamber a substrate comprising a first region comprising an exposed strained semiconductor layer,
 b) forming a conformal first species containing-layer by vapor phase deposition (VPD) at least on the exposed strained semiconductor layer, and thereafter
 c) performing a first thermal treatment, thereby diffusing at least part of the first species from the first species-containing layer into the (exposed) strained semiconductor layer and activating at least part of the diffused first species in the (exposed) strained semiconductor layer.

Preferably, in a method of the invention, the substrate comprises a second region comprising an exposed strained semiconductor layer, and the method further comprises (or consists of) the steps of:
 d) after diffusing the first species into the exposed strained semiconductor layer of the first region, forming a diffusion mask thereby covering the first region of the substrate,
 e) forming in a reaction chamber a conformal second species containing-layer by vapor phase deposition (VPD) at least on the exposed strained semiconductor layer (of the second region), and thereafter
 f) performing a second thermal treatment, thereby diffusing at least part of the second species from the second species-containing layer into the (exposed) strained semiconductor layer (of the second region), and activating at least part of the diffused first species and/or the diffused second species in the (exposed) strained semiconductor layer (of the second region).

Preferably, in a method of the invention, the (first and/or second) thermal treatment comprises rapid thermal processing (RTP), rapid thermal annealing (RTA), laser anneal, or any combinations thereof. More preferably, the (first and/or second) thermal treatment for use in a method of the invention is a rapid thermal processing, even more preferably a spike anneal.

Preferably, in a method of the invention, the rapid thermal processing is conducted at a temperature of from (about) 800° C. to (about) 1300° C., preferably from (about) 900° C. to (about) 1200° C., more preferably from (about) 1000° C. to (about) 1100° C., most preferably at a temperature of (about) 1050° C.

Preferably, in a method of the invention, the soak time for the rapid thermal processing is comprised between (about) 0.1 sec to (about) 1.5 sec, more preferably between (about) 0.5 sec to (about) 1.5 sec, even more preferably the soak time for the rapid thermal processing is (about) 1 sec. Even more preferably, the (first and/or second) thermal treatment for use herein is a rapid thermal processing, more preferably a spike anneal at (about) 1050° C. for (about) 1 s.

Preferably, in a method of the invention, the exposed strained semiconductor layer (of said first and/or second region) comprises a native oxide layer atop, and the method further comprises the step of removing the native oxide layer from the exposed strained semiconductor layer (of said first and/or second region).

In a preferred method of the invention, a diffusion control layer (DCL) is formed at least on the exposed strained semiconductor layer (of the first and/or second region), prior to forming the conformal first and/or second species-containing-layer.

Preferably, in a method of the invention, the first species are n-type dopants preferably selected from the group consisting of arsine ($AsH_3$), phosphine ($PH_3$) or mixtures thereof, and the second species are p-type dopants preferably selected to be diborane.

Preferably, in a method of the invention, the step of forming the conformal n-type dopants containing layer is performed at a temperature lower than the dopants desorption limit.

Preferably, in a method of the invention, the step of forming the conformal p-type dopants containing layer is performed at a temperature lower than the dopants in-diffusion limit.

Preferably, in a method of the invention, underneath the strained (semiconductor) layer the substrate comprises bulk silicon, silicon-on-insulator (SOI), $Si_xGe_{1-x}$ (0<x<1) on SOI, $Si_xGe_{1-x}$ (0<x<1) on Si, bulk Ge or mixtures thereof.

More preferably, in a method of the invention, the strained semiconductor layer comprises strained Si, strained Ge, strained $Si_xGe_{1-x}$ (0<x<1), a strained III-V material, strained SiC or mixtures thereof. Even more preferably, in a method of the invention, the strained semiconductor layer consists of strained Si.

Preferably, in a method of the invention, the diffusion control layer is silicon oxide.

Preferably, in a method of the invention, the step of forming the first and/or second species-containing layer comprises (or consists of) the step of injecting a first and/or second species-containing precursor and a carrier gas in the reaction chamber, and the carrier gas is preferably selected from the group consisting of $N_2$, $H_2$, He, or mixtures thereof; more preferably the carrier gas is selected to be $N_2$.

Preferably, in a method of the invention, the step of forming the first and/or second species-containing layer is performed at a pressure comprised between (about) 10 torr (131 Pa) and (about) 1 atm (10 kPa).

Preferably, in a method of the invention, the reaction chamber is an epitaxial reactor, a low pressure chemical vapor deposition (LPCVD) chamber, a reduced pressure chemical vapor deposition (RPCVD) chamber, an atmospheric pressure chemical vapor deposition (APCVD) chamber, a ultra high vacuum chemical vapor deposition (UHV-CVD) chamber, or a gas source molecular beam chamber (GSMBE). More preferably, the reaction chamber is a reduced pressure chemical vapor deposition (RPCVD) chamber.

According to another aspect, the present invention relates to a semiconductor device comprising a substrate comprising a channel region and at least a strained region modified with dopants adjacent to the channel region, the strained region inducing a carrier mobility enhancement in the channel region before introducing the dopants, wherein the carrier mobility enhancement induced by the strained region is essentially (or substantially) kept (or maintained) upon dopants introduction and dopants activation, for a dopant dose equivalent or higher to a dose conventionally used to form the extensions regions of a sub-100 nm MOSFET.

Preferably, in a semiconductor device of the invention, the strained region consists of strained Si and the substrate further comprises bulk silicon, silicon-on-insulator (SOI), relaxed SiGe on Si, bulk Ge or mixtures thereof.

In still another aspect of the present invention, it is provided a method for introducing species into a narrow fin structure to form a conformal dopant profile, wherein the method comprises (or consists of) the steps of:

a) providing in a reaction chamber a substrate comprising at least an exposed fin structure, made in a semiconductor material having an initial degree of crystallinity and having a fin width, b) forming a conformal species containing-layer by vapor phase deposition (VPD) at least on the exposed fin structure, and thereafter c) performing a thermal treatment, thereby diffusing at least part of the species from the species-containing layer conformal into the (exposed) fin structure and activating at least part of the diffused species in the (exposed) fin structure, thereby forming a conformal dopant profile with a depth higher or equal to of the fin width and preserving the initial degree of crystallinity of the semiconductor material.

Preferably, in this method of the invention for introducing species into a narrow fin structure, the thermal treatment comprises rapid thermal processing (RTP), rapid thermal annealing (RTA), laser anneal, or any combinations thereof. More preferably, the thermal treatment for use in a method of the invention is a rapid thermal processing, even more preferably a spike anneal.

Preferably, in a method of the invention, the rapid thermal processing is conducted at a temperature of from (about) 800° C. to (about) 1300° C., preferably from (about) 900° C. to (about) 1200° C., more preferably from (about) 1000° C. to (about) 1100° C., most preferably at a temperature of (about) 1050° C.

Preferably, in a method of the invention, the soak time for the rapid thermal processing is comprised between (about) 0.1 sec to (about) 1.5 sec, more preferably between (about) 0.5 sec to (about) 1.5 sec, even more preferably the soak time for the rapid thermal processing is (about) 1 sec. Even more preferably, the (first and/or second) thermal treatment for use herein is a rapid thermal processing, more preferably a spike anneal at (about) 1050° C. for (about) 1 s.

In a preferred method of the invention, a diffusion control layer (DCL) is formed at least on the exposed fin structure, prior to forming the conformal species-containing-layer.

Preferably, in a method of the invention, the species are n-type dopants preferably selected from the group consisting of arsine ($AsH_3$), phosphine ($PH_3$) or mixtures thereof, and/or the species are p-type dopants preferably selected to be diborane.

Preferably, in a method of the invention, the step of forming the conformal n-type dopants containing layer is performed at a temperature lower than the dopants desorption limit.

Preferably, in a method of the invention, the step of forming the conformal p-type dopants containing layer is performed at a temperature lower than the dopants in-diffusion limit.

Preferably, in a method of the invention, the method further comprises (or consists of) the step of growing an epitaxial monolayer of the semiconductor material which the fin structure is made of, upon the conformal species containing layer, thereby introducing/incorporating the species in substitutional sites in the fin structure. More preferably, in this method of the invention, the step of performing a thermal treatment as specified above, is omitted.

Preferably, in a method of the invention, a sequence consisting of forming a conformal species containing layer and growing an epitaxial monolayer of the semiconductor material is repeated at least twice, thereby increasing the concentration of the species incorporated/introduced in the semiconductor substrate.

Still preferably, in between sequences as above described, an epitaxial monolayer of a second semiconductor material is formed.

Preferably, in this method of the invention, the fin width is smaller or equal to (about) 20 nm.

In another aspect of the present invention, it is provided a semiconductor device comprising a substrate comprising a fin structure having a fin width and being modified with dopants having a conformal dopants profile and a dopants profile depth, wherein the fin structure is made in a semiconductor material having an initial degree of crystallinity before dopants introduction, and the dopants profile depth is higher or equal to (about) of the fin width, wherein the fin structure preserves (or maintains) its degree of crystallinity upon dopants introduction and dopants activation, for a dopants dose equivalent or higher to a dose used to form the extensions regions of a sub-100 nm MOSFET.

Preferably, in a semiconductor device of the invention, the fin width is smaller or equal to (about) 20 nm.

In still another aspect, the present invention relates to a method to manufacture a hetero-epitaxial junction with a matched dopant concentration, the method comprising (or consisting of) the step of providing a first semiconductor material having a first level of doping and forming thereupon by in-situ doped epitaxial growth a second semiconductor material having a second level of doping, wherein prior to forming the second semiconductor material, a vapor phase deposition step is performed on the first semiconductor material, thereby adjusting the first level of doping to become equal (to match) the second level of doping.

Preferably, in this method of the invention, the first semiconductor material is silicon and the second semiconductor material is $Si_xGe_{1-x}$, with $0<x<1$.

According to still another aspect, the present invention is directed to the use of vapor phase deposition (VPD) to achieve conformal doping of a strained semiconductor layer or of a narrow fin structure (or of a semiconductor structure), wherein the fin structure has preferably a fin width smaller or equal to (about) 20 nm.

In yet another aspect, the present invention relates to the use of vapor phase deposition (VPD) for introducing species into a strained semiconductor layer or of a narrow fin structure (or a semiconductor structure), wherein the fin structure has preferably a fin width smaller or equal to (about) 20 nm, and wherein the species are preferably selected from n-type dopants and/or p-type dopants.

The invention however, both as to organization and method of operation, together with features and advantages thereof, may best be understood by reference to the following detailed description when read with the accompanying drawings.

BRIEF DESCRIPTION OF THE DRAWINGS

All drawings are intended to illustrate certain aspects and embodiments of the present invention. The drawings described are only schematic and are non-limiting.

FIG. 5(c) represents the simulated drive current of the FinFET device with (a) top-only extensions; (b) conformal extensions.

DETAILED DESCRIPTION OF THE INVENTION

The invention will now further be described by a detailed description of several particular embodiments of the invention. It is clear that other embodiments of the invention can be configured according to the knowledge of persons skilled in the art without departing from the true spirit or technical teaching of the invention.

In the following detailed description, numerous specific details are set forth in order to provide a thorough understanding of the invention and how it may be practiced in particular embodiments. However it will be understood that the present invention may be practiced without these specific details. In other instances, well-known methods, procedures and techniques have not been described in detail, so as not to obscure the present invention. While the present invention will be described with respect to particular embodiments and with reference to certain drawings, the reference is not limited hereto. The drawings included and described herein are schematic and are not limiting the scope of the invention. It is also noted that in the drawings, the size of some elements may be exaggerated and, therefore, not drawn to scale for illustrative purposes.

Furthermore, the terms first, second and the like in the description, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Moreover, the terms top, bottom, over, under and the like in the description are used for descriptive purposes and not necessarily for describing relative positions. It is to be understood that the terms so used are interchangeable under appropriate circumstances and that the embodiments of the invention described herein are capable of operation in other orientations than described or illustrated herein.

Where, herein, a specific chemical name or formula is given, the material may include non-stoichiometric variations of the stoichiometrically exact formula identified by the chemical name. Lack of a numerical subscript by an element in the formula stoichiometrically signifies the number one (1). Variations in the range plus/minus 20% of the exact stoichiometric number are comprised in the chemical name or formula, for the present purposes. Where an algebraic subscript is given, then variations in the range of about plus/minus 20% are comprised relative to the value of each subscript. Such varied values do not necessarily sum to a whole number and this departure is contemplated. Such variations may occur due to either intended selection and control of the process conditions, or due to unintended process variations.

In the present invention, the term "III-V compound semiconductor" denotes a semiconductor material that includes at least one element from Group III of the Periodic Table of Elements and at least one element from Group V of the Periodic Table of Elements. Typically, the III-V compound semiconductors are binary, ternary or quaternary alloys including III/V elements. Examples of III-V compound semiconductors that can be used in the present invention include, but are not limited to alloys of GaAs, InP, InSb, InGaAs, AlGaAs, InAlAs, InAlAsSb, InAlAsP and InGaAsP.

Strained-silicon technology is promising route to enhance metal-oxide-semiconductor field-effect transistor (MOSFET) performance due to improved carrier transport properties.

In particular, abiaxially-strained silicon on insulator substrate (abbreviated SSOI) is a promising source of strain engineering for the future CMOS technology nodes. The tensile stress in the Si layer results in an increased carrier mobility with respect to unstrained SOI. This in turn results in an enhanced drive current.

When a thin Si layer is grown pseudomorphically on a relaxed SiGe buffer layer having larger lattice spacing than that of Si, the Si layer conforms to the SiGe template by expanding laterally and contracting vertically resulting in a biaxial strain, which enhances the transport properties compared to un-strained Si. Improvements to both electron and hole mobilities by applying biaxial tensile strained Si as a transistor channel are demonstrated.

In developing high performance CMOS uniaxial strain is also used to enhance the carrier mobility. In this approach a significant strain is imposed on the device in a preferred direction relative to the channel. This is achieved either by a stressor incorporation in selected adjacent areas, or by locally altering the film characteristics.

As the scaling of strained-Si MOSFETs continues, the performance enhancement may become susceptible to degradation during processing. Particularly from ion implantation and thermal processing effects.

More specifically, the ion implant dose under the gate (e.g., associated with the halo and/or extensions implants) increases with scaling. In addition, the damage associated with the source/drain extension regions may comprise a larger portion of the channel as the device is scaled. Ion implantation damage may supply point defects that assist the relaxation of strain or the up-diffusion of species (e.g. Ge) from the underlying layers.

In addition to that, residual ion implantation damage, remaining after thermal annealing, may act as carrier scattering centers. In strained-Si films thermal processing such as i.e. post implantation anneal can cause misfit dislocations, leading to strain relaxation as well as enhanced impurity diffusion, resulting ultimately in decreased carrier mobility.

It has been observed that the mobility enhancement due to induced strain in the channel is lost for ultra-short planar devices. This can be explained by a layer relaxation caused during Extension and HDD (Highly Doped Drain) fabrication modules. The ion implantation amorphizes the extensions and/or the source/drain areas and during the re-crystallisation process the strain is lost especially for the shortest channel lengths (e.g. sub-100 nm MOSFETs).

In one aspect of the present invention, it is disclosed a method for introducing species into a strained semiconductor layer, comprising providing in a reaction chamber a substrate comprising a first region comprising (or consisting of) an exposed strained semiconductor layer, then forming a conformal first species containing-layer by vapor phase deposition (VPD) at least on the exposed strained semiconductor layer, and thereafter performing a thermal treatment, thereby diffusing at least part of the first species from the first species-containing layer into the (exposed) strained semiconductor layer and activating at least part of the diffused first species in the (exposed) strained semiconductor layer.

In the context of the present invention, the term "exposed strained semiconductor layer" is herein meant to refer to any part of the strained semiconductor layer which is not covered by any other layers. Also, in the context of the present invention, the term "activating the diffused first species" is meant to express electrical activation of the diffused first species by bringing the diffused first species into substitutional sites in the lattice of the (exposed) strained semiconductor layer.

Forming a conformal first species containing-layer by vapor phase deposition at least on the exposed strained semiconductor layer can comprise either a selective process such as e.g. forming a conformal first species containing-layer only on the exposed strained semiconductor layer, or a non-selective process, e.g. forming a conformal first species containing-layer both on the exposed and non-exposed strained semiconductor layer. However, other suitable processes for forming a conformal first species containing-layer by vapor phase deposition at least on the exposed strained semiconductor layer will be easily recognized by those skilled in the art. Throughout the description, by "conformal layer", it is meant herein a layer which follows the topography of the device/structure onto which it is applied/formed.

In another aspect, the present invention discloses a method in which the substrate comprises a second region comprising an exposed strained semiconductor layer, the method further comprising (or consisting of): after diffusing the first species into the exposed strained semiconductor layer of the first region, forming a diffusion mask thereby covering the first region of the substrate prior to loading the substrate, then forming in a reaction chamber a conformal second species containing-layer by vapor phase deposition (VPD) at least on the exposed strained semiconductor layer (of the second region). The reaction chamber used in this step can be the same reaction chamber as used in forming the first conformal species containing-layer, or a different reaction chamber. In these embodiments, the method also includes a second thermal treatment, thereby diffusing at least part of the second species from the second species-containing layer into the (exposed) strained semiconductor layer (of the second region) and activating at least part of the diffused first species and/or the diffused second species in the (exposed) strained semiconductor layer.

Essentially, Vapor Phase Deposition (VPD) is (preferably) a Chemical Vapor Deposition (CVD) process in which species (or dopants) are deposited directly onto a substrate (e.g. preferably a semiconductor material or a strained semiconductor material) through pyrolysis of a precursor gas, such as e.g. (preferably) diborane ($B_2H_6$) for p-type doping and phosphine ($PH_3$) or (preferably) arsine ($AsH_3$) for n-type doping. This deposition follows the device topography and thus leads to conformal layers. However, other processes for achieving vapor phase deposition will be easily recognized by those skilled in the art, and those are suitable for use in the context of the present invention.

After the deposition step, a thermal treatment (e.g., the first and/or second thermal treatments) (anneal) is needed to diffuse the species (or dopants) into the substrate, e.g. (preferably) a strained layer or another semiconductor structure. Any thermal treatment well know in the field may be used in the context of the present invention. Such suitable thermal treatments, which will be easily identified by those skilled in the art, comprise but are not limited to rapid thermal processing (RTP), rapid thermal annealing (RTA), laser anneal, or any combinations thereof. A typical rapid thermal processing (RTP) involves ramping up the substrate to a target temperature of preferably (about) 1050° C., soaking the substrate at the target temperature for a period of time (soak time), and ramping down the substrate to a base temperature of preferably (about) 200° C. In case of a 'spike anneal', a typical RTP used to prevent excessive dopant diffusion, high ramp rates, preferably (about) 75° C./sec or higher, and short (about 1 sec) or no soak time are desired.

According to a preferred aspect, the (first and/or second) thermal treatment for use herein is a rapid thermal processing, more preferably a spike anneal. Preferably, the rapid thermal processing is conducted at a temperature of from (about) 800° C. to (about) 1300° C., preferably from (about) 900° C. to (about) 1200° C., more preferably from (about) 1000° C. to (about) 1100° C., most preferably at a temperature of (about) 1050° C. Preferably, the soak time for the rapid thermal processing is comprised between (about) 0.5 sec to (about) 1.5 sec, more preferably the soak time for the rapid thermal processing is (about) 1 sec. Alternatively, the rapid thermal processing is conducted with no soak time. In a more preferred aspect, the (first and/or second) thermal treatment for use herein is a rapid thermal processing, more preferably a spike anneal at (about) 1050° C. for (about) 1 s.

Figure 1:
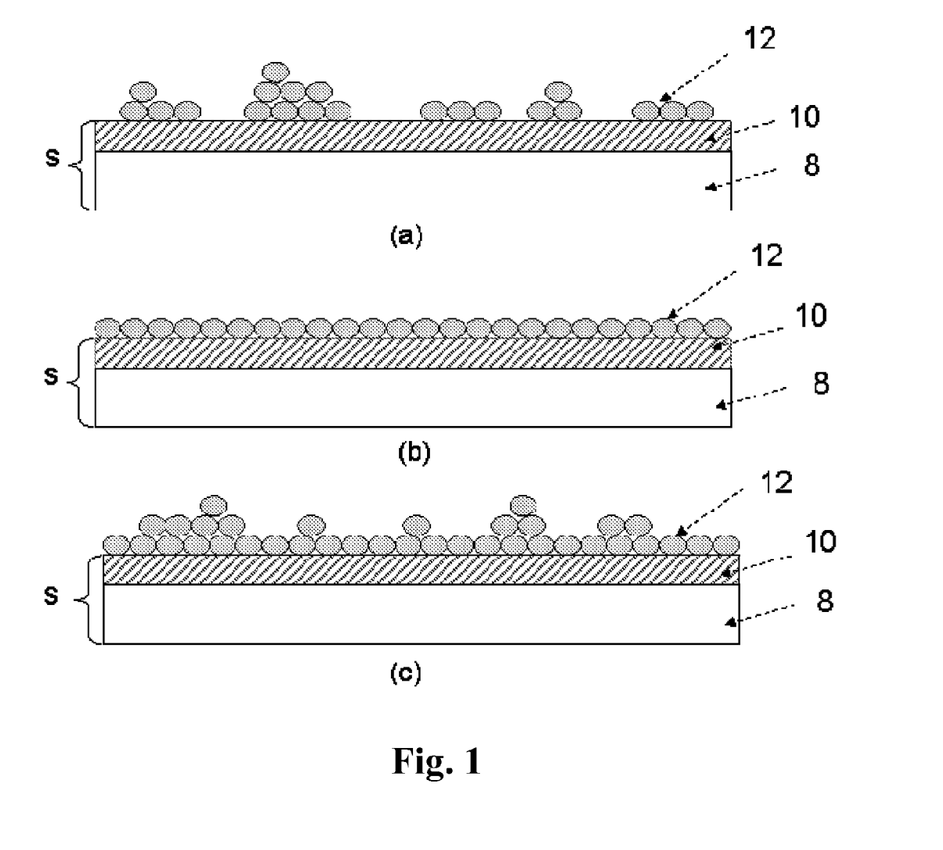
FIG. 1 represents schematically the vapor phase deposition (VPD) process, wherein the substrate (S) comprises a bulk semiconductor material such as e.g. Si or Ge or a SOI/GeOI structure (8) and an exposed strained semiconductor layeror semiconductor structure (10). The species containing layer (12) has (a) coverage<1; (b) coverage=1, layer thickness=1 monolayer (ML); (c) coverage=1, layer thickness>1 monolayer. The coverage is herein defined as the ratio between the area covered with species and the total exposed area.

Alternatively, the (first and/or second) thermal treatment is a laser anneal. Preferably, the laser anneal is a sub-melt millisecond anneal. According to a particular aspect, the sub-melt millisecond anneal is performed by using a diode bar laser system with a laser wavelength of (about) 808 nm and a fixed scan speed of (about) 150 mm/s corresponding to a dwell time of (about) 0.5 ms. FIG. 1 represents schematically the vapor phase deposition process on a substrate (S) comprising a bulk semiconductor material such as Si or Ge, or a SOI/GeOI stack (8) and an exposed strained semiconductor layer or semiconductor structure (10) of a species containing layer (12). The following embodiments are represented schematically: (a) coverage<1; (b) coverage=1, layer thickness=1 monolayer (ML); (c) coverage=1, layer thickness>1 mL. Hereinafter the coverage is defined as the ratio between the area covered with species and the total exposed area.

In some aspects of the present invention, the first and/or second species-containing layer is a discontinuous layer, having a coverage lower than 1.

In some aspects of the present invention, the first and/or second species-containing layer is a continuous layer, having a coverage equal to 1 and a layer thickness of at least 1 monolayer.

In some aspects of the present invention, the exposed strained semiconductor layer comprises a native oxide layer atop (e.g. preferably a thin $SiO_2$ layer in case of the exposed Si strained layer). In these aspects, the method of the invention can comprise further removing the native oxide layer from the exposed strained semiconductor layer. The native oxide layer can be removed either by a wet cleaning step performed before loading the substrates into the reaction chamber, or in-situ in the reaction chamber by a thermal treatment in $H_2$ atmosphere ($H_2$ bake) or by a combination of both wet cleaning and in-situ thermal treatment.

In some aspects of the present invention, a diffusion control layer (DCL) is (preferably) formed at least on the exposed strained semiconductor layer, prior to forming the conformal first and/or second species-containing-layer. Suitable diffusion control layers for use herein will be easy apparent to those skilled in the art.

In different aspects of the present invention, the first species and the second species are (preferably) dopants. Advantageously, in some embodiments the first species are n-type dopants and the second species are p-type dopants, Forming the conformal first and/or second dopants containing layer has to be performed (preferably) at a temperature lower than the corresponding dopant desorption limit for the n-type dopants and, respectively, lower than the dopant in-diffusion limit for the p-type dopants. The dopant desorption limit is defined as the temperature at which the dopants start to desorb from the substrate. The dopant in-diffusion limit is defined as the temperature at which the dopants start to diffuse into the substrate.

In some aspects of the invention, the n-type dopants are (preferably) selected from the group consisting of arsine ($AsH_3$), phosphine ($PH_3$) or mixtures thereof. Advantageously, forming the conformal arsine/phosphine containing layer is performed at a temperature lower or equal to the dopant desorption limit. In case of arsine, the dopant desorption limit is (about) 600° C.

In another aspects, the p-type dopants consist (preferably) of diborane. Advantageously, forming the conformal diborane containing layer is performed at a temperature lower or equal to the dopant in-diffusion limit. In case of diborane and silicon substrate the dopant in-diffusion limit is (about) 700° C.

In particular aspects of the present invention, the first species are (preferably) n-type dopants (preferably arsine, phosphine) and the second species are (preferably) p-type dopants (diborane). More preferably, the n-type dopants are selected to be arsine.

In different aspects of the present invention, the substrate (preferably) comprises bulk silicon, silicon-on-insulator (SOI), $Si_xGe_{1-x}$ (0<x<1) on SOI, $Si_xGe_{1-x}$ (0<x<1) on Si, bulk Ge or mixtures thereof underneath the strained semiconductor layer.

In different aspects of the present invention the strained semiconductor layer (preferably) comprises strained IV materials like strained Si, strained Ge, strained IV-IV materials like strained $Si_xGe_{1-x}$ strained $Si_xC_{1-x}$ strained $Ge_xSn_{1-x}$, strained $Ge_xSi_ySn_{1-x-y}$ with x and y real numbers and 0<x, y<1, strained III-V materials, or mixtures thereof.

In some particular aspects of the present invention, the substrate (preferably) comprises SOI and strained Si.

In a specific aspect of the present invention, the diffusion control layer is (preferably) a silicon oxide. Advantageously, the silicon oxide is formed by wet processing in oxidative chemistries.

In a further specific aspect of the present invention, the thermal treatment (e.g., the first and/or second thermal treatment) is (preferably) a spike anneal at (preferably) 1050° C. for 1 s. However, this is a non-limitative example illustrative for the allowable thermal budget. Other combinations are possible depending on the integration scheme. Finding such combinations is well within the practice of those skilled in the art.

In some aspects of the present invention, forming the first and/or second species-containing layer comprises injecting a first and/or second species-containing precursor and a carrier gas in the reaction chamber. Preferably, the carrier gas is selected from the group consisting of $N_2$, $H_2$, He or mixtures thereof. More preferably, the carrier gas is $N_2$, having the additional advantage of a higher deposition rate.

Some aspects of the present invention disclose forming the first and/or second species-containing layer at a pressure between (about) 10 torr (131 Pa) and (about) 1 atm (10 kPa). The reaction chamber can be, for example, an epitaxial reactor, a low pressure chemical vapor deposition (LPCVD) chamber, a reduced pressure chemical vapor deposition (RPCVD) chamber, an atmospheric pressure chemical vapor deposition (RPCVD) chamber or a ultra high vacuum chemical vapor deposition (UHVCVD) chamber, or a gas source molecular beam chamber (GSMBE). Preferably, the reaction chamber for use herein is a reduced pressure chemical vapor deposition (RPCVD) chamber.

In another aspect of the present invention, a semiconductor device is disclosed comprising a substrate comprising a channel region and at least a strained region modified with dopants adjacent to the channel region, the strained region inducing a carrier mobility enhancement in the channel region before introducing the dopants, wherein the carrier mobility enhancement induced by the strained region is essentially (or substantially) kept (or maintained) upon dopants introduction and dopants activation, for a dopant dose equivalent or higher to the dose conventionally used to form the extension regions of a sub-100 nm MOSFET transistor.

Hereinbelow, a mobility enhancement corresponds to an enhancement factor higher than 1, wherein the enhancement factor is defined as the ratio between the carrier mobility of the strained device and the carrier mobility of the un-strained device.

A typical dopant dose conventionally used to form the extensions implants of a sub-100 nm MOSFET transistor is $5 \times 10^{14}$ $cm^{-2}$ Boron at 10 keV (p-type dopants) or $1 \times 10^{15}$ $cm^{-2}$ Arsenic at 30 keV (n-type dopants), e.g. in strained Si substrate. A dopants dose equivalent or higher to the dose conventionally used to form the extension regions of a sub-100 nm MOSFET transistor is a dopants dose that produces at least the same damage in a substrate as ion implanted $5 \times 10^{14}$ $cm^{-2}$ Boron at 10 keV in strained silicon. The damage produced by ion implanted B and/or As in strained Si can be quantified by the percentage of amorphization of the strained Si substrate and the decrease in carrier mobility of the device formed on the strained Si substrate upon ion implantation and high temperature (e.g. 1000° C.) anneal. The method of the invention prevents the damage and keeps the benefit of the strained substrates un-altered.

In some aspects, the strained region is a strained semiconductor layer, e.g. (preferably) a strained Si layer wherein the extensions and/or the source/drain regions of a transistor are formed. In particular aspects, the strained regions modified with dopants are (preferably) extensions regions and/or source/drain regions of a transistor.

In different aspects, the substrate comprises further, bulk silicon, silicon-on-insulator (SOI), relaxed SiGe on Si, bulk Ge or mixtures thereof underneath the strained region.

When compared to planar junctions, junction formation on multi-gate 3-D structures, commonly referred to as FinFET or MuGFET present additional challenges in achieving conformal doping profiles. More specifically, because of the unidirectional nature of the ion beam used and of the shadowing effect at elevated structures (fins), it can be difficult to achieve a conformal FinFET junction using conventional ion implantation technique.

Especially for very narrow fins, i.e. with the fin width below (about) 20 nm, the amorphous-Si (amorphization) formed as a result of the conventional ion implantation steps cannot be fully recovered (re-grown) to crystalline Si by thermal anneal. Even at high temperatures (in the example below 1050° C.) poly-Si is formed instead of crystalline Si on the top of the fin, which lead to lower selectivity and fin thinning during the subsequent selective epitaxial growth (SEG).

In different aspects of the present invention, a method is disclosed for introducing species into a narrow fin structure (e.g. of a FinFET device) to form a conformal dopant profile comprising: providing in a reaction chamber a substrate comprising at least an exposed fin structure, made in a semiconductor material having an initial degree of crystallinity and having a fin width, then forming a conformal species containing-layer by vapor phase deposition (VPD) at least on the exposed fin structure, and thereafter performing a thermal treatment, thereby diffusing at least part of the species from the species-containing layer conformal into the exposed fin structure and activating at least part of the diffused species in the exposed fin structure, thereby forming a conformal dopant profile with a depth higher or equal to ½ of the fin width and preserving the initial degree of crystallinity of the semiconductor material.

In the context of the present invention, the term "conformal dopant profile" is meant to refer to a dopant profile that follows the topography of the fin structure. By the term "exposed fin structure", it is herein meant to describe a fin structure that is not covered by any other layer.

In the context of the method of the invention, any thermal treatment well know in the field may be used herein. Such suitable thermal treatments, which will be easily identified by those skilled in the art, comprise but are not limited to rapid thermal processing (RTP), rapid thermal annealing (RTA), laser anneal, or any combinations thereof. A typical rapid thermal processing (RTP) involves ramping up the substrate to a target temperature of preferably (about) 1050° C., soaking the substrate at the target temperature for a period of time (soak time), and ramping down the substrate to a base temperature of preferably (about) 200° C. In case of a 'spike anneal', a typical RTP used to prevent excessive dopant diffusion, high ramp rates, preferably (about) 75° C./sec or higher, and short (about 1 sec) or no soak time are desired.

According to a preferred aspect, the thermal treatment for use herein is a rapid thermal processing, more preferably a spike anneal. Preferably, the rapid thermal processing is conducted at a temperature of from (about) 800° C. to (about) 1300° C., preferably from (about) 900° C. to (about) 1200° C., more preferably from (about) 1000° C. to (about) 1100° C., most preferably at a temperature of (about) 1050° C. Preferably, the soak time for the rapid thermal processing is comprised between (about) 0.1 sec to (about) 1.5 sec, more preferably between (about) 0.5 sec to (about) 1.5 sec, even more preferably the soak time for the rapid thermal processing is (about) 1 sec. Alternatively, the rapid thermal processing is conducted with no soak time. In a more preferred aspect, the thermal treatment for use herein is a rapid thermal processing, more preferably a spike anneal at (about) 1050° C. for (about) 1 s.

Alternatively, the thermal treatment is a laser anneal. Preferably, the laser anneal is a sub-melt millisecond anneal. According to a particular aspect, the sub-melt millisecond anneal is performed by using a diode bar laser system with a laser wavelength of (about) 808 nm and a fixed scan speed of (about) 150 mm/s corresponding to a dwell time of (about) 0.5 ms.

Particular aspects of the invention disclose forming fully conformal p-type and n-type extensions in multi-gate transistors with fin topography (FinFETs) by Vapor Phase Deposition with a fin width smaller than (about) 20 nm and more preferably smaller than (about) 10 nm.

Figure 6:
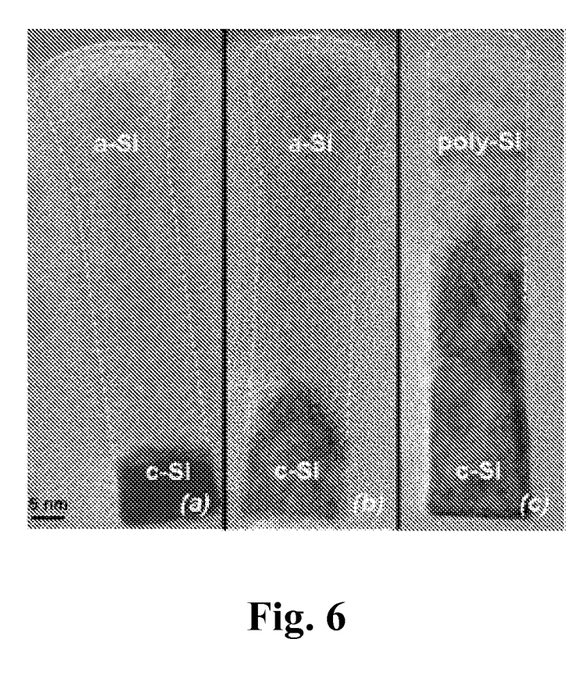
FIG. 6 shows a cross section transmission electron microscopy (XTEM) picture of a sub-20 nm wide Si fin, wherein a-Si is amorphous Si, c-Si is crystalline Si and poly-Si is polycrystalline Si; (a) after As deep implant (b) after As implant and annealing at 600° C. for (c) after As implant and rapid thermal annealing (RTA) at 1050° C.

As shown in FIG. 6 and in the corresponding paragraphs describing FIG. 6, when performing an (conventional) ion implantation into a narrow fin structure, aiming a dopants profile depth equal or higher than ½ of the fin width, with a dopants dose corresponding to a conventional dose used to form the extensions regions of a sub 100 nm MOSFET, an amorphization of the fin structure occurs during the (conventional) ion implantation and there is not enough silicon seed left to completely re-crystallize thereafter the fin structure. Even upon a high temperature anneal, the upper part of the fin structure remains poly-crystalline.

Advantageously, the extensions regions of a FinFET structure, can be formed by using vapor phase deposition followed by thermal anneal. In this case, the thermal treatment (anneal) to diffuse the dopants into the fins can be performed at the same time with the activation anneal of the HDD (Highly Doped Drain) implants, reducing in this way the total temperature budget and simplifying the manufacturing flow. In a conventional CMOS flow, the extension formation is done prior to the HDD implantation, and the spike anneal that activates these HDD-implants provides enough thermal budget for the in-diffusion of the deposited extension dopants.

In some cases, the thermal budget of the activation anneal after HDD implants may be too high, leading to a too deep extension dopant profile. To prevent this unwanted effect, different aspects of the present invention disclose depositing/growing a conformal dielectric on the semiconductor substrate or the fin structures prior to the VPD. The dielectric acts as diffusion control layer (DCL) for the dopants during the activation anneal, leading to shallower dopant profiles. The dielectric is sacrificial and can be removed after the activation anneal through e.g. an HF-based wet-etch processing.

The composition and thickness of the dielectric and the vapor phase deposition parameters can be varied to obtain the requested final dopants profile (after activation anneal) in the semiconductor substrate (e.g., strained layer) or semiconductor structure (e.g., fin structure). Finding suitable combination of parameters (optimization) is well within the practice of those skilled in the art. A diffusion control layer with a typical thickness of about 1 nm, can be formed by a cleaning process in oxidative mixtures, e.g. IMEC clean. The IMEC clean comprises forming a chemical (wet) oxide by performing an $O_3$/de-ionized water treatment at the end of the cleaning sequence.

The temperature and/or pressure range of the VPD process is chosen such as to prevent during deposition the reflow of the semiconductor material that the fin structure is made of. In the context of the present invention, the term "reflow" is meant to describe the surface diffusion of the semiconductor material of the fin structure as a consequence of the VPD process conditions. This is particularly important in the case of the narrow fin structures, with a width of e.g. (preferably) less than 20 nm or more preferably less than (about) 10 nm, since the reflow can drastically distort the fin topography. The specific conditions at which reflow can occur depends on the semiconductor material (Si, Ge, III-V compound, etc.). In the case of Si, significant reflow is observed above (about) 600° C. at reduced pressures (10-40 torr), which limits the VPD process window on exposed Silicon to temperatures lower than (about) 600° C. or pressures higher than (about) 40 torr.

Advantageously, the diffusion control layer (dielectric) atop the substrate and/or fin structure containing a semiconductor material prevents the reflow of the underlying semiconductor material and, consequently, broadens the VPD (temperature/pressure) process window mentioned in the preceding paragraph.

Figure 2:
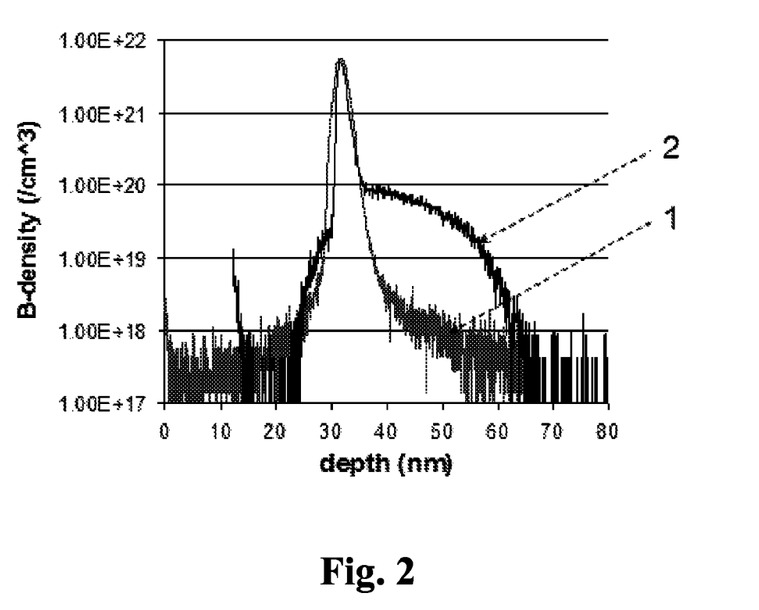
FIG. 2 shows SIMS (Secondary Ion Mass Spectrometry) results for a VPD B-doped Si substrate (blanket wafer): (1) as-deposited B profile; (2) B-profile after a thermal activation anneal.

FIG. 2 shows SIMS (Secondary Ion Mass Spectrometry) results for a VPD B-doped Si substrate (blanket wafer), as follows: (1) as-deposited B profile; (2) B-profile after a thermal activation anneal at (about) 1050° C. for (about) is under $N_2$. In both cases, a capping layer was deposited at (about) 600° C. immediately prior to the SIMS measurement, to allow accurate measurement.

Figure 3:
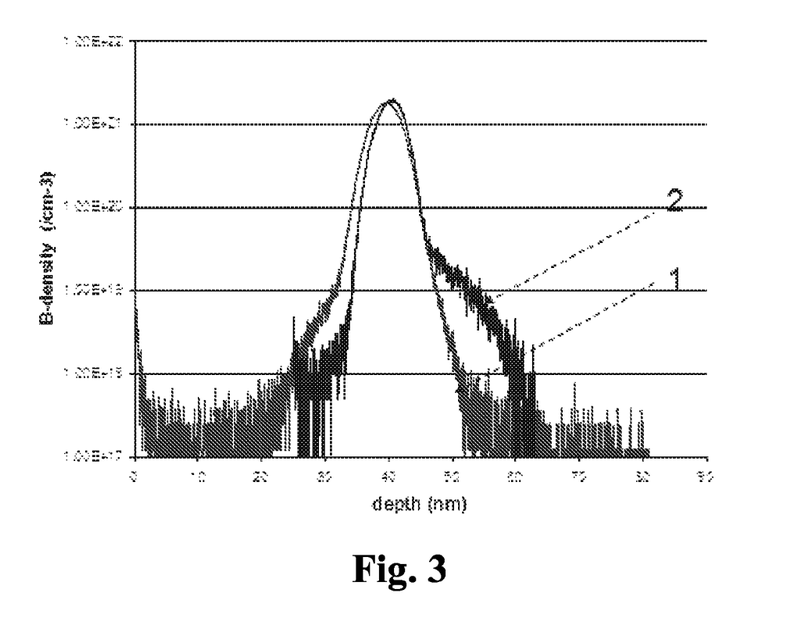
FIG. 3 shows SIMS results for a VPD B-doped sample having a chemical oxide on top of the Si substrate, wherein the chemical oxide is formed prior to the VPD step: (1) as-deposited B profile (2) B-profile after thermal activation anneal.

FIG. 3 shows SIMS results for a VPD B-doped sample having a chemical oxide with a thickness of (about) 1 nm on top of the Si substrate, wherein the chemical oxide is formed by IMEC clean prior to the VPD step: (1) as-deposited B profile (2) B-profile after thermal activation anneal at (about) 1050° C. for (about) is under $N_2$. In both cases, a capping layer was deposited at (about) 600° C. immediately prior to the SIMS measurement, to allow accurate measurement.

Comparing the as-deposited peaks (curve 1, in FIGS. 2 and 3) reveals a lower Boron dose on oxide with respect to Silicon (100) ($1 \times 10^{15}$ cm$^{-2}$ on oxide vs. $1.7 \times 10^{15}$ cm$^{-2}$ on Si), indicating a lower sticking coefficient on oxide compared to Si. To compensate for the lower sticking coefficient, the initial deposited dose can be varied by adjusting the deposition time or the dopant precursor flow. As shown in FIG. 2 and FIG. 3, Boron deposited on the oxide shows a much shallower in-diffusion profile (curve 2, FIG. 3), indicating that the thin chemical oxide acts as an effective diffusion control layer. As can be estimated from the figures, the in-diffusion depth is in the first case (on Si) is about 27 nm, while the in-diffusion depth in the second case (on oxide) is about 16 nm.

In alternative aspects of the present invention, the method further comprises (or consists of) growing an epitaxial monolayer of the semiconductor material the fin structure is made of, upon the conformal species containing layer, thereby introducing/incorporating the species in substitutional sites in the fin structure. This combination of Vapor Phase Deposition (VPD) and epitaxial growth will be herein further referred to as Atomic Layer Epitaxy (ALE).

Advantageously, a sequence consisting of forming a conformal species containing layer and growing an epitaxial monolayer of the semiconductor material can be repeated at least twice, thereby increasing the concentration of the species incorporated/introduced in the semiconductor substrate.

In different aspects of the present invention, the species are dopants, every dopant deposition step (VPD) is followed by an epitaxial deposition/growth of a semiconductor material (such as Si, Ge, $Si_xGe_{1-x}$ with 0<x<1, etc.) and thereafter a new dopant deposition can be done. The sequence VPD-epitaxial growth can be repeated a number of times (cycles) until the required thickness and/or dopants concentration is achieved. The dopant dose deposited in one cycle does not exceed the equivalent of one monolayer of the semiconductor material. Consequently, the dopants are integral/completely incorporated in substitutional sites during the epitaxial deposition; with the advantage that no (additional) activation anneal (i.e. thermal treatment) is needed.

In some aspects, in between sequences, an epitaxial monolayer of a second semiconductor material is formed. As a result, a hetero-epitaxial semiconductor material (e.g. 1 monolayer of Si and 1 monolayer of Ge) is formed upon the dopant containing layer and the sequence VPD-epitaxial growth is repeated a number of times (cycles).

Figure 4:
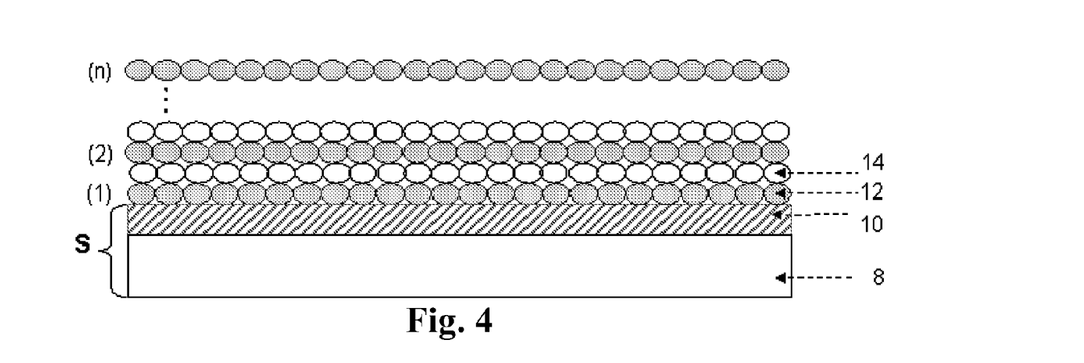
FIG. 4 represents schematically the Atomic Layer Epitaxy (ALE) process, wherein the substrate (S) comprises a bulk semiconductor material (e.g. Si or Ge) or a SOI/GeOI structure (8) and an exposed strained semiconductor layer/semiconductor structure (10). Further, the figure makes reference to (12)—species containing layer, (14) semiconductor material epitaxially grown/deposited directly onto the species containing layer.

FIG. 4 represents schematically the Atomic Layer Epitaxy (ALE) process, wherein S is a substrate comprising a bulk semiconductor material such as Si or Ge or a SOI/GeOI stack (8) and an exposed semiconductor structure (10). On the exposed semiconductor structure (10) a species containing layer (12) and a semiconductor material containing layer (14) are deposited in one VPD-epitaxial growth sequence. In some aspect, the sequence can be repeated 'n' times (cycles), each cycle comprising (or consisting of) depositing a species containing layer (12) and forming a monolayer of a semiconductor material (14).

Advantageously, when using Atomic Layer Epitaxy very high active levels can be obtained, above the solid solubility limit of the dopants, since the growth processes are non-equilibrium processes which can be performed below the surface diffusion temperature of the dopants.

In different aspects of the present invention, a semiconductor device is disclosed comprising a substrate comprising a fin structure having a fin width and being modified with dopants having a conformal dopants profile and a dopants profile depth, wherein the fin structure is made in a semiconductor material having an initial degree of crystallinity before dopants introduction, and the dopants profile depth is higher or equal to of the fin width, wherein the fin structure preserves (or maintains) its degree of crystallinity upon dopants introduction and dopants activation, for a dopants dose equivalent or higher to a dose used to form the extensions regions of a sub-100 nm MOSFET.

In the context of the present invention, the term "conformal dopants profile" is meant to refer to a dopants profile that follows the topography of the fin structure. The term "dopants profile depth" is herewith meant to refer to the total distance (measured on a direction perpendicular to the exposed surface of the fin structure) that dopants penetrate into the fin structure.

Typical examples of dopants doses conventionally used to form the extensions regions of a sub-100 nm MOSFET are discussed elsewhere in the description.

Figure 5:
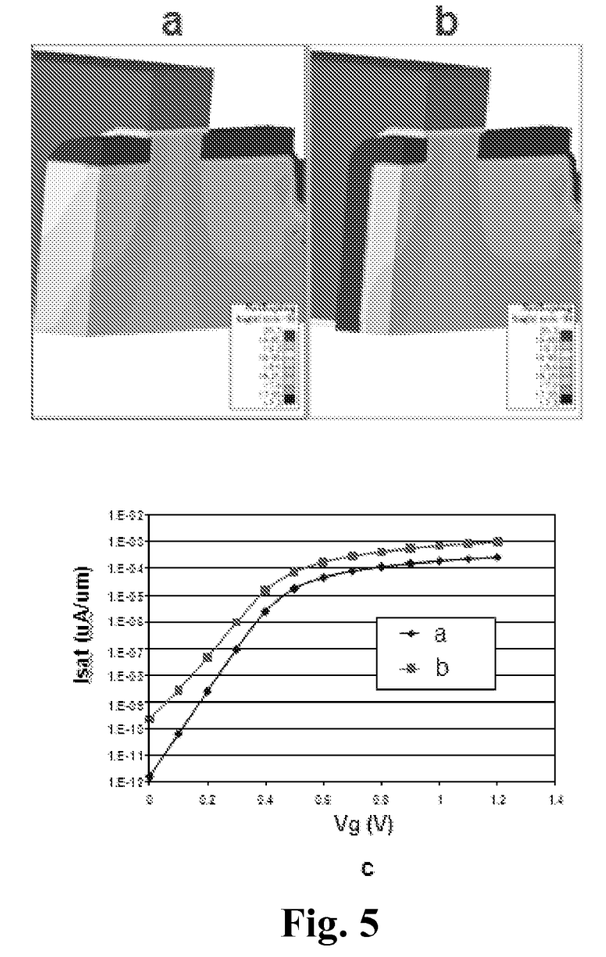
FIG. 5 represents a cross section of a FinFET device with (a) top-only extensions; (b) conformal extensions.

Conformal doped junctions fabricated with the method of the invention can enable obtaining higher drive currents. FIG. 5 represents a cross section of a FinFET device with (a) top-only extensions; (b) conformal extensions. FIG. 5(c) represents the simulated drive current of a FinFET device with (a) top-only doped junction and (b) conformal doped junction. A doubling of the drive current is estimated with conformal doping of the FinFET for fins structures with a width of (about) 35 nm, and a height of (about) 60 nm and for $V_{dd}$=1.2V.

An additional advantage of the invention is that vapor phase deposition/atomic layer epitaxy (i.e. ALE) can prevent the amorphization of the narrow fin structures. Especially for very narrow fins, with the fin width below (about) 20 nm, the amorphous-Si formed as a result of the conventional ion implantation steps cannot be fully recovered (re-grown) to crystalline Si by thermal anneal. Even at high temperatures (in the example below 1050° C.) polycrystalline Si is formed instead of crystalline Si in the upper part of the fin, which can lead to lower selectivity and fin thinning during the subsequent selective epitaxial growth (SEG).

In line with the above, FIG. 6 shows a cross section transmission electron microscopy (XTEM) picture of a sub-20 nm wide Si fin, wherein a-Si is amorphous Si, c-Si is crystalline Si and poly-Si is polycrystalline Si; (a) after As deep implant with a dopant profile depth of about 16 nm (b) after As implant and annealing at (about) 600° C. for 60 s (c) after As implant and rapid thermal annealing (RTA) at (about) 1050° C. After As deep implant an amorphization of the top 50 nm is observed as shown in FIG. 6 (a) where the top 50 nm has a light grey colour corresponding to amorphous Si. After a thermal anneal at (about) 600° C. for (about) 60 s an incomplete regrowth is observed as shown in FIG. 6(b) by a slightly bigger c-Si region (dark grey) at the bottom of the fin structure. After RTA at (about) 1050° C. a complete regrowth is observed, but many twin boundary defects are still present as shown in FIG. 6(c). Moreover, top 25 nm has transformed into polycrystalline silicon (light grey on the picture), which can lead to additional thinning of the fins during the subsequent selective epitaxial growth (SEG). Additional thinning of fins takes place because selective epitaxial growth is a combination of reactive deposition and etching steps, both reactions occurring simultaneously. Process conditions of the SEG are chosen such that preferential semiconductor deposition occurs on crystalline semiconductor (e.g. Si) surfaces and preferential etching occurs on the masking surfaces (e.g. oxide and nitride). This allows selective epitaxial growth, meaning deposition of semiconductor material on the open semiconductor surface and preventing deposition of semiconductor material on the masking surface. However, the etching speed increases with decreasing material quality of the semiconductor layer. Where suitable process conditions enable selective deposition with a positive growth rate on monocrystalline surfaces, etching rate might be higher than growth rate for the polycrystalline semiconductor surfaces. This negative growth rate (etching) results in unwanted thinning of the fins.

In the aspects wherein conformal fin extension doping is performed by Atomic Layer Epitaxy, the fins and the source/drain regions can be etched back partially prior to the doping process, followed by a selective re-growth in cyclic steps as described in previous aspects.

In a particular aspect, Si samples (wafers) with fin topography were investigated. The wafers with fin topography were first subjected to a cleaning step (IMEC clean) forming a thin chemical oxide acting as a diffusion control layer, then the junctions were formed by B-VPD ($B_2H_6$) at (about) 600° C. and a pressure of (about) 20 torr (263 Pa), followed by a spike anneal at (about) 1050° C.

Figure 7:
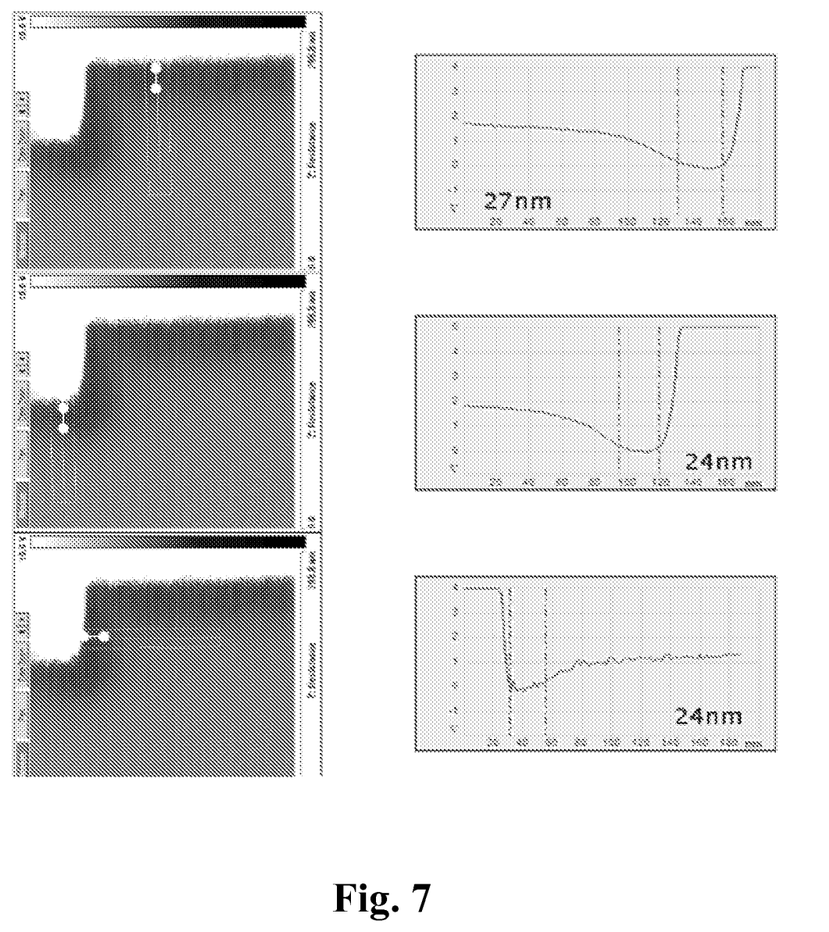
FIG. 7 shows SSRM (Scanning Spreading Resistance Microscopy) images (left) and calculated junction depths (right) of the junctions formed by B VPD deposition at 600° C. and a pressure of 20 torr (263 Pa) on bulk Si with fin topography.

FIG. 7 shows the SSRM (Scanning Spreading Resistance Microscopy) images (left) and calculated junction depths (right) of the junctions formed by B-VPD on a bulk Si substrate with fin topography. SSRM is a method for two-dimensional profiling of localized resistance on a semiconductor cross-sectional surface, allowing analysis of the distribution of electron carriers and impurities. The measurements reveal the formation of highly conformal junctions, with a depth of (about) 24-27 nm.

Different aspects of the present invention disclose using Vapor Phase Deposition to achieve conformal doping of a substrate such as e.g. (preferably) a semiconductor strained layer or of a semiconductor structure (e.g. preferably a fin structure), while preserving its strain properties and/or its crystallinity degree.

According to the present invention, the use of Vapor Phase Deposition to achieve conformal doping of a substrate is the single general inventive concept linking the different aspects of the present invention.

A non-limitative example of using Vapor Phase Deposition to achieve uniform/matched doping profiles at hetero-epitaxial interfaces while, at the same time, simplifying the conventional manufacturing flow is disclosed hereinbelow.

In another aspect of the invention, a method to manufacture a hetero-epitaxial junction with a matched dopant concentration is disclosed, comprising (or consisting of) providing a first semiconductor material having a first level of doping and forming thereupon by in-situ doped epitaxial growth a second semiconductor material having a second level of doping, wherein prior to forming the second semiconductor material, a vapor phase deposition step is performed on the first semiconductor material, thereby adjusting the first level of doping to become equal (to match) the second level of doping.

By the expression "in-situ doped epitaxial growth", it is herein meant to refer to an epitaxial growth wherein dopants are supplied in the process chamber ("in-situ") and are incorporated into the grown material during the growth process.

In particular aspects, a method is disclosed to pre-dope the source-drain areas of a transistor prior to epi-tip (e.g. preferably $Si_xGe_{1-x}$ with 0<x<1 epitaxial layer) formation/growth, such as to allow high active dopant levels close to the top Si surface, equal (matched) with the dopants level in the epitaxially grown epi-tip. Consequently, a better match of the dopant concentration on both sides of the $Si_xGe_{1-x}$ (0<x<1)/Si interface is achieved. An example of conventional vs alternative manufacturing flow is described below.

Advanced CMOS manufacturing makes use of a thin Si or strained $Si_xGe_{1-x}$ (0<x<1) layer grown selectively on/in the Source/Drain (e.g. S/D) areas, known in the art as the 'epi-tip' approach. The purpose of the epi-tip is threefold: (1) to reduce the S/D contact resistance by e.g. growing an epitaxial $Si_xGe_{1-x}$ (0<x<1); since $Si_xGe_{1-x}$ (0<x<1) has a lower band gap than Si, (2) to form elevated layers on SOI substrates (e.g. S/D junctions are obtained either by growing in-situ doped epi layers or by performing an ion implantation step after the epitaxial growth) in order to reduce the short channel effects, and (3) to induce stress and consequently enhance carrier mobility in the e.g. Si channel by growing a $Si_xGe_{1-x}$ (0<x<1) epi layer (4) epi-tip is used on bulk, to enable a further reduction of the junction depth for conventional ion implantation.

Different integration schemes are followed to form the epi-tip. In the first approach a Si-recess is first formed in a substrate, such that the epi-tip (epitaxially grown layer) is at the same level as the channel. This approach results in a stress transfer from the epitaxially grown layer (e.g. $Si_xGe_{1-x}$, with 0<x<1) into the channel, and in a reduction of the contact resistance. In the second approach, the epi-tip is grown atop of the substrate, which enables a further reduction of the junction depth for conventional ion implantation. This approach has the additional advantage of avoiding the dry etch step used to form the recess, but the stress transfer into the Si channel is less pronounced. Another option is to combine the recess and the elevation. Device process on SOI substrates requires elevation.

In the particular case of an epitaxially grown layer made of $Si_xGe_{1-x}$ (0<x<1), it is beneficial to have the HDD junction inside the underlying silicon substrate and not at the $Si_xGe_{1-x}$ (0<x<1)/Si interface, since the lower $Si_xGe_{1-x}$ (0<x<1) band gap has a detrimental effect on the junction leakage.

When using conventional ion implantation, the implantation depth can be chosen just below the $Si_xGe_{1-x}$ (0<x<1)/Si interface. However, from the manufacturing point of view, it is beneficial to deposit in-situ doped $Si_xGe_{1-x}$ (0<x<1), that can be used as diffusion source. Species (e.g. boron) in the in-situ doped $Si_xGe_{1-x}$ (0<x<1) diffuse during a thermal treatment in the underlying Si substrate to form there the HDD junction. This allows simplifying the manufacturing flow by omitting the implantation module, which includes besides the ion implantation step also resist deposition, litho patterning and cleaning steps.

Figure 8:
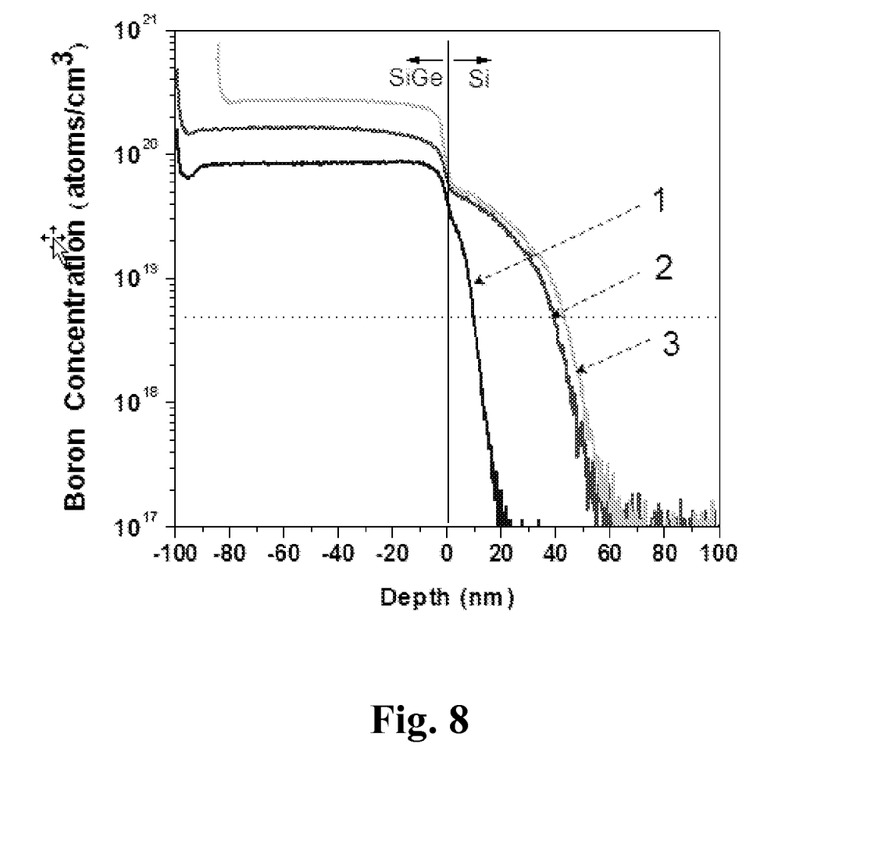
FIG. 8 represents the boron profile at the $Si_xGe_{1-x}$ ($0<x<1$)/Si interface, after out-diffusion from the in-situ doped $Si_xGe_{1-x}$ ($0<x<1$) into the underlying (initially undoped) Si; (1) 15% Ge without rapid thermal anneal (RTA); (2) 15% Ge with RTA; (3) 25% Ge.

However, when using in-situ doped $Si_xGe_{1-x}$ (0<x<1) without ion implantation it is difficult to match vertically the very high active dopant level in the epitaxially grown $Si_xGe_{1-x}$ (0<x<1) (epi-tip) with the dopant level in the underlying Si. Using conventional process observed at the $Si_xGe_{1-x}$ (0<x<1)/Si interface, even after boron out-diffusion from the in-situ doped $Si_xGe_{1-x}$ (0<x<1) into the underlying Si (initially undoped), as shown in FIG. 8. In the case of elevated $Si_xGe_{1-x}$ (0<x<1) (without Si recess) this drop in dopants concentration can lead to an enhanced contact resistance between the silicide and the extension implant.

Aspects of the present invention disclose using vapor phase deposition to pre-dope the source-drain areas prior to epi-tip (e.g. $Si_xGe_{1-x}$, with 0<x<1 epitaxial layer) formation/growth, to allow high active dopant levels close to the top Si surface. Consequently, a better match of the dopant concentration on both sides of the $Si_xGe_{1-x}$ (0<x<1)/Si interface can be achieved.

According to still another aspect, the present invention is directed to the use of vapor phase deposition (VPD) to achieve conformal doping of a strained semiconductor layer or of a narrow fin structure, or of a semiconductor structure. Preferably, the fin structure has a fin width smaller or equal to (about) 20 nm.

In yet another aspect, the present invention relates to the use of vapor phase deposition (VPD) for introducing species into a strained semiconductor layer or a narrow fin structure, or a semiconductor structure, Preferably, the fin structure has a fin width smaller or equal to (about) 20 nm, and the species are preferably selected from n-type dopants and/or p-type dopants.

The invention claimed is:

1. A method for introducing species into a strained semiconductor layer, wherein said method comprising:
    a) providing in a reaction chamber a substrate comprising a first region comprising an exposed strained semiconductor layer and a second region comprising an exposed strained semiconductor layer,
    b) forming a conformal first species containing-layer by vapor phase deposition at least on the exposed strained semiconductor layer of the first region, and thereafter
    c) performing a first thermal treatment, thereby diffusing at least part of the first species from the first species-containing layer into the strained semiconductor layer of the first region and activating at least part of the diffused first species in the strained semiconductor layer of the first region,
    d) after diffusing the first species into the exposed strained semiconductor layer of the first region, forming a diffusion mask thereby covering the first region of the substrate,
    e) forming in a reaction chamber a conformal second species containing-layer by vapor phase deposition at least on the exposed strained semiconductor layer of the second region, and thereafter
    f) performing a second thermal treatment, thereby diffusing at least part of the second species from the second species-containing layer into the strained semiconductor layer of the second region, and activating at least part of the diffused first species and/or the diffused second species.

2. The method according claim 1, wherein said thermal treatment comprises rapid thermal processing, rapid thermal annealing, laser anneal, or a combination thereof.

3. The method according to claim 1, wherein the exposed strained semiconductor layer of the first region, of the second region, or both comprises a native oxide layer at its top surface, and wherein said method further comprises removing the native oxide layer from the exposed strained semiconductor layer.

4. The method according to claim 1, wherein a diffusion control layer is formed at least on the exposed strained semiconductor layer of the first region, of the second region, or both, prior to forming the conformal first and/or second species-containing-layer.

5. The method according to claim 1, wherein the first species is an n-type dopant, and the second species is a p-type dopant.

6. The method according to claim 5, wherein the forming the conformal n-type dopant containing layer is performed at a temperature lower than the dopant desorption limit.

7. The method according to claim 5, wherein the forming the conformal p-type dopant containing layer is performed at a temperature lower than the dopant desorption limit.

8. The method according to claim 1, wherein underneath the strained layer the substrate comprises bulk silicon, silicon-on-insulator, $Si_xGe_{1-x}$ ($0 \leq x \leq 1$) on silicon-on-insulator, $Si_xGe_{1-x}$ ($0 \leq x \leq 1$) on Si, bulk Ge or a mixture thereof.

9. The method according to claim 5, wherein the first species is an n-type dopant selected from arsine, phosphine and mixtures thereof, and the second species is diborane.

10. The method according to claim 1, wherein the strained semiconductor layer comprises strained Si, strained Ge, strained $Si_xGe_{1-x}$ ($0 \leq x \leq 1$), a strained III-V material, strained SiC or a mixture thereof.

11. The method according to claim 1, wherein the strained semiconductor layer consists of strained Si.

12. The method according to claim 4, wherein the diffusion control layer is silicon oxide.

13. The method according to claim 1, wherein the forming the first and/or second species-containing layer comprises the step of injecting a first and/or second species-containing precursor and a carrier gas in the reaction chamber.

14. The method according to claim 1, wherein the step of forming the first and/or second species-containing layer is performed at a pressure between 10 torr and 1 atm.

15. The method according to claim 1, wherein the reaction chamber is an epitaxial reactor, a low pressure chemical vapor deposition chamber, a reduced pressure chemical vapor deposition chamber, an atmospheric pressure chemical vapor deposition chamber, a ultra high vacuum chemical vapor deposition chamber, or a gas source molecular beam chamber.

16. The method according to claim 13, wherein the carrier gas is selected from $N_2$, $H_2$, He or a mixture thereof.

17. The method according to claim 13, wherein the carrier gas is $N_2$.

18. The method according to claim 1, wherein the first species is an n-type dopant; the second species is a p-type dopant; underneath the strained layer the substrate comprises bulk silicon, silicon-on-insulator, $Si_xGe_{1-x}$ ($0 \leq x \leq 1$) on silicon-on-insulator, $Si_xGe_{1-x}$ ($0 \leq x \leq 1$) on Si, bulk Ge or a mixture thereof; and the strained semiconductor layer comprises strained Si, strained Ge, strained $Si_xGe_{1-x}$ ($0 \leq x \leq 1$), a strained III-V material, strained SiC or a mixture thereof.

19. A method for introducing species into a strained semiconductor layer, wherein said method comprising:
    a) providing in a reaction chamber a substrate comprising a first region comprising an exposed strained semiconductor layer,
    b) forming a diffusion control layer is formed at least on the exposed strained semiconductor layer, and thereafter
    c) forming a conformal first species containing-layer by vapor phase deposition at least on the exposed strained semiconductor layer, and thereafter
    d) performing a first thermal treatment, thereby diffusing at least part of the first species from the first species-containing layer into the strained semiconductor layer and activating at least part of the diffused first species in the strained semiconductor layer.

20. The method according to claim 19, wherein underneath the strained layer the substrate comprises bulk silicon, silicon-on-insulator, $Si_xGe_{1-x}$ ($0 \leq x \leq 1$) on silicon-on-insulator, $Si_xGe_{1-x}$ ($0 \leq x \leq 1$) on Si, bulk Ge or a mixture thereof.

21. The method according to claim 19, wherein the strained semiconductor layer comprises strained Si, strained Ge, strained $Si_xGe_{1-x}$ ($0 \leq x \leq 1$), a strained III-V material, strained SiC or a mixture thereof.

22. The method according to claim 19, wherein the diffusion control layer is silicon oxide.

23. The method according claim 19, wherein said thermal treatment comprises rapid thermal processing, rapid thermal annealing, laser anneal, or a combination thereof.

24. The method according to claim 19, wherein the exposed strained semiconductor layer comprises a native oxide layer at its top surface, and wherein said method further comprises removing the native oxide layer from the exposed strained semiconductor layer.

25. The method according to claim 19, wherein underneath the strained layer the substrate comprises bulk silicon, silicon-on-insulator, $Si_xGe_{1-x}$ ($0 \leq x \leq 1$) on silicon-on-insulator, $Si_xGe_{1-x}$ ($0 \leq x \leq 1$) on Si, bulk Ge or a mixture thereof; and the strained semiconductor layer comprises strained Si, strained Ge, strained $Si_xGe_{1-x}$ ($0 \leq x \leq 1$), a strained III-V material, strained SiC or a mixture thereof.

* * * * *